(12) United States Patent
Lin et al.

(10) Patent No.: US 8,482,059 B2
(45) Date of Patent: Jul. 9, 2013

(54) SEMICONDUCTOR STRUCTURE AND MANUFACTURING METHOD FOR THE SAME

(75) Inventors: Chen-Yuan Lin, Taitung (TW);
Cheng-Chi Lin, Toucheng Township, Yilan County (TW); Shih-Chin Lien, New Taipei (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 160 days.

(21) Appl. No.: 13/101,486

(22) Filed: May 5, 2011

(65) Prior Publication Data
US 2012/0280316 A1 Nov. 8, 2012

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl.
USPC .......................................... 257/328; 257/335

(58) Field of Classification Search
USPC ................................... 257/328, 335
See application file for complete search history.

(56) References Cited

U.S. PATENT DOCUMENTS
2011/0140201 A1* 6/2011 Lin et al. ...................... 257/342

* cited by examiner

*Primary Examiner* — Thien F Tran
(74) *Attorney, Agent, or Firm* — McClure, Qualey & Rodack, LLP

(57) ABSTRACT

A semiconductor structure and a manufacturing method for the same are provided. The semiconductor structure includes a first doped well, a first doped electrode, a second doped electrode, doped strips and a doped top region. The doped strips are on the first doped well between the first doped electrode and the second doped electrode. The doped strips are separated from each other. The doped top region is on the doped strips and extended on the first doped well between the doped strips. The first doped well and the doped top region have a first conductivity type. The doped strips have a second conductivity type opposite to the first conductivity type.

10 Claims, 15 Drawing Sheets

US 8,482,059 B2

SEMICONDUCTOR STRUCTURE AND MANUFACTURING METHOD FOR THE SAME

BACKGROUND

1. Technical Field

The disclosure relates in general to a semiconductor structure and a manufacturing method for the same, and more particularly to a HV semiconductor device and a manufacturing method for the same.

2. Description of the Related Art

In the semiconductor technology, the feature size has been reduced. In the meantime, the rate, the efficiency, the density and the cost per integrated circuit unit have been improved. In a method for increasing an operating voltage in a conventional device, for example, field plate regions having the same surface profile and different depth ranges are formed on a drift region by using the single mask. However, reduction of the resistance and increase of the on-state current of the device by this kind of method are still limited.

SUMMARY

A semiconductor structure is provided. The semiconductor structure comprises a first doped well, a first doped electrode, a second doped electrode, doped strips and a doped top region. The doped strips are on the first doped well between the first doped electrode and the second doped electrode. The doped strips are separated from each other. The doped top region is on the doped strip and extended on the first doped well between the doped strips. The first doped well and the doped top region have a first conductivity type. The doped strips have a second conductivity type opposite to the first conductivity type.

A manufacturing method for a semiconductor structure is provided. The method comprises following steps. Doped strips are formed on a first doped well. The doped strips are separated from each other. A doped top region is formed on the doped strip and extended on the first doped well between the doped strips. A first doped electrode and a second doped electrode are formed on the first doped well on opposite sides of the doped top region, respectively. The first doped well and the doped top region have a first conductivity type. The doped strips have a second conductivity type opposite to the first conductivity type.

DETAILED DESCRIPTION

Embodiments relate to a semiconductor structure and a manufacturing method for the same. The semiconductor structure has doped strips and a doped top region between doped electrodes. The doped strips are separated from each other. The doped top region is on the doped strip and extended on a region between the doped strips. Thus, the on-state resistance of the semiconductor structure is reduced. The on-state current is increased to have a high efficiency. Nevertheless, the semiconductor structure could be operated by a high voltage.

Figure 1:
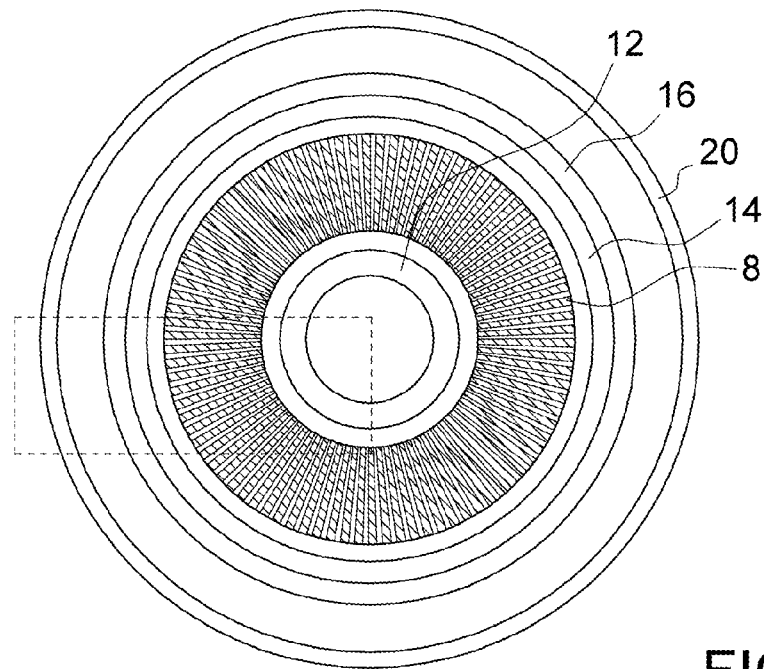
FIG. 1 illustrates a top view of the semiconductor structure according to one embodiment.
Figure 2:
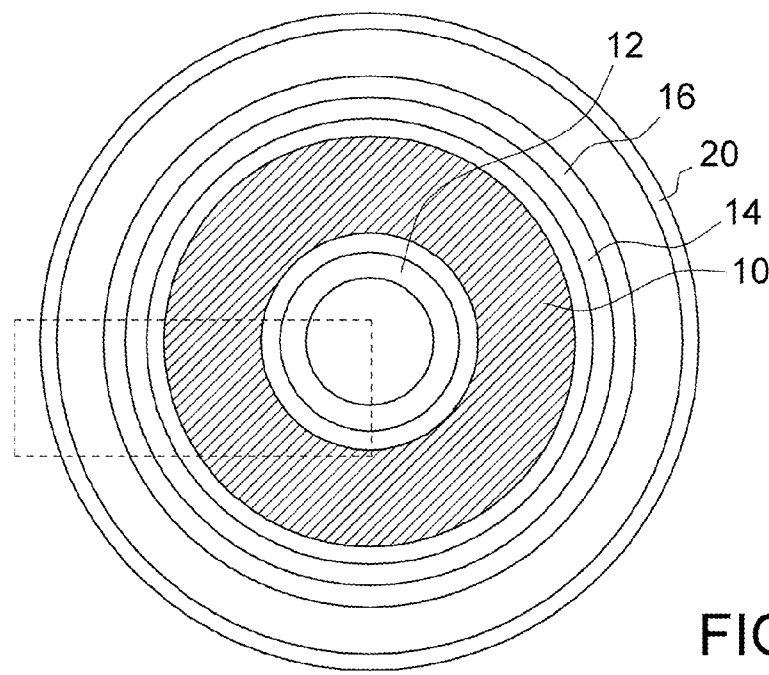
FIG. 2 illustrates a top view of the semiconductor structure according to one embodiment.
Figure 3:
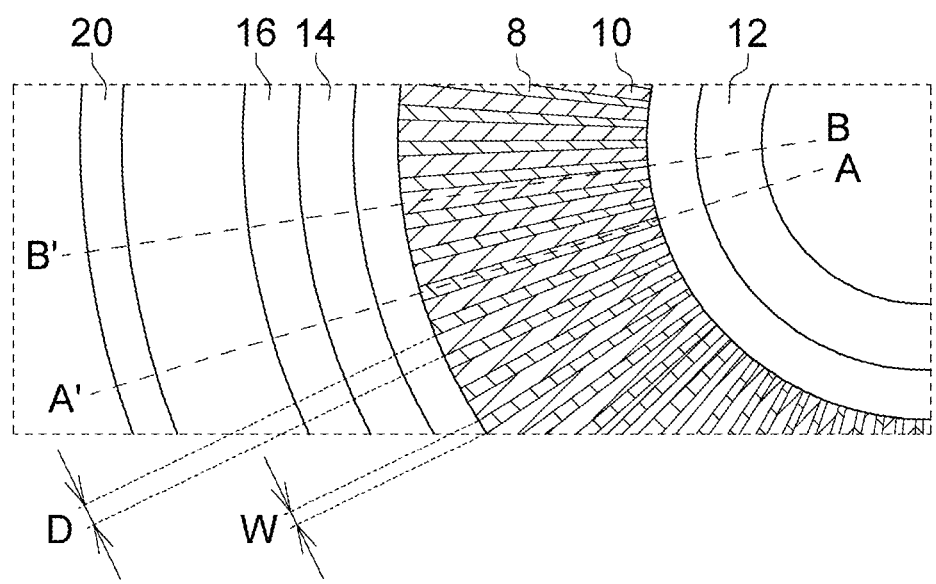
FIG. 3 illustrates a top view of the semiconductor structure according to one embodiment.
Figure 4:
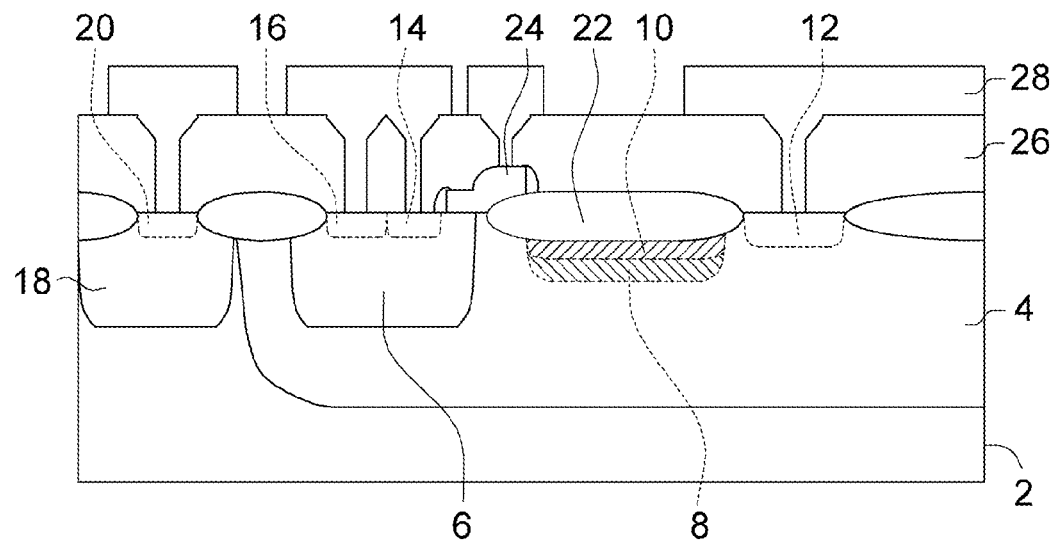
FIG. 4 illustrates a cross-section view of the semiconductor structure according to one embodiment.
Figure 5:
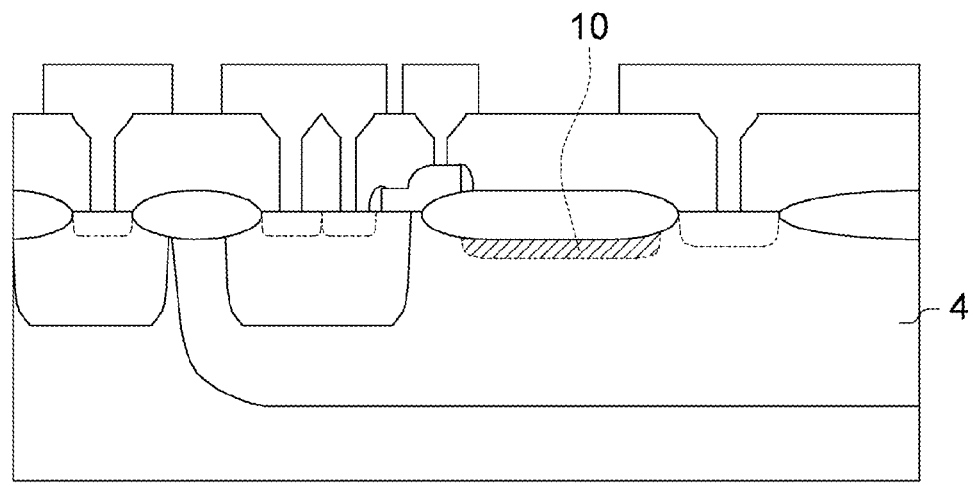
FIG. 5 illustrates a cross-section view of the semiconductor structure according to one embodiment.
Figure 6:
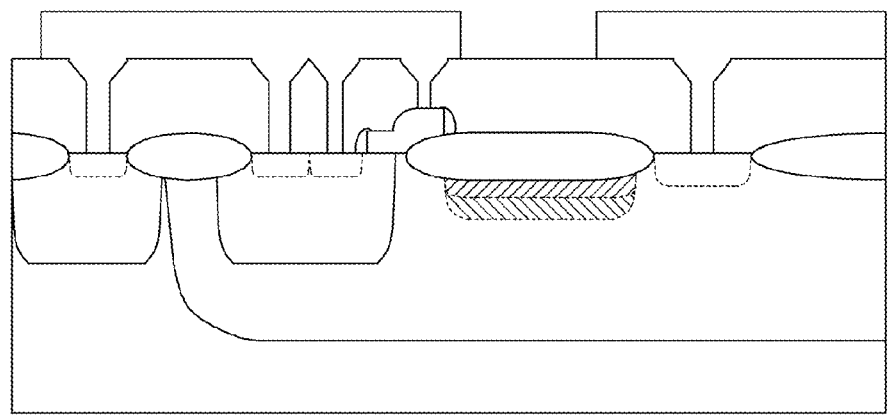
FIG. 6 illustrates a cross-section view of the semiconductor structure according to one embodiment.
Figure 7:
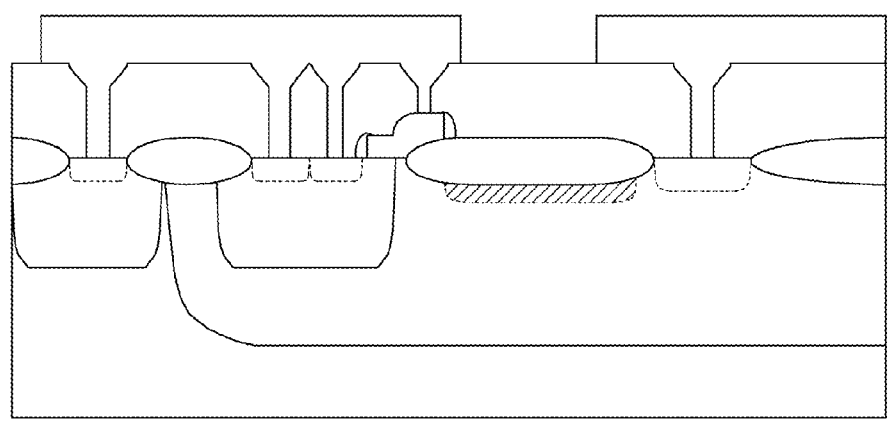
FIG. 7 illustrates a cross-section view of the semiconductor structure according to one embodiment.
Figure 8:
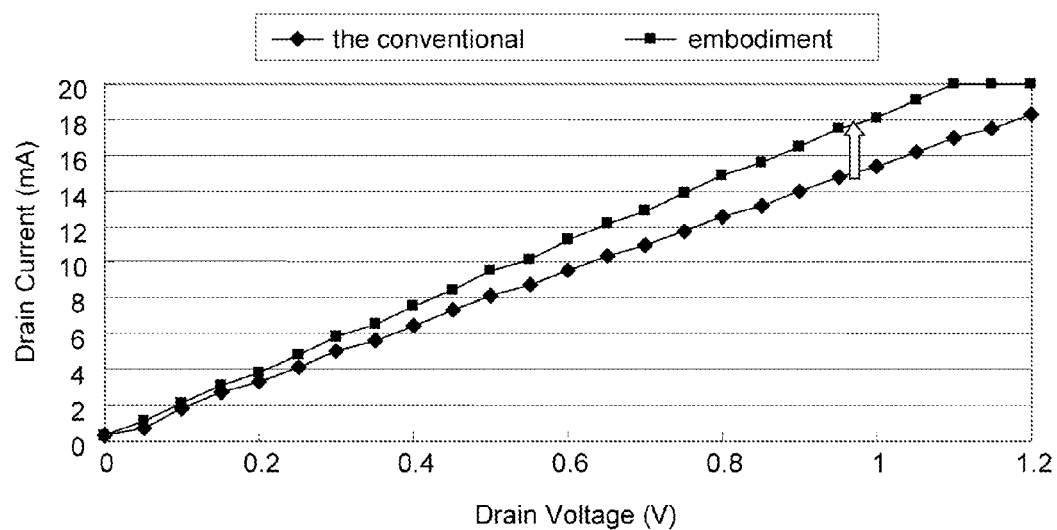
FIG. 8 illustrates an I-V curve of the semiconductor structure in one embodiment.
Figure 9:
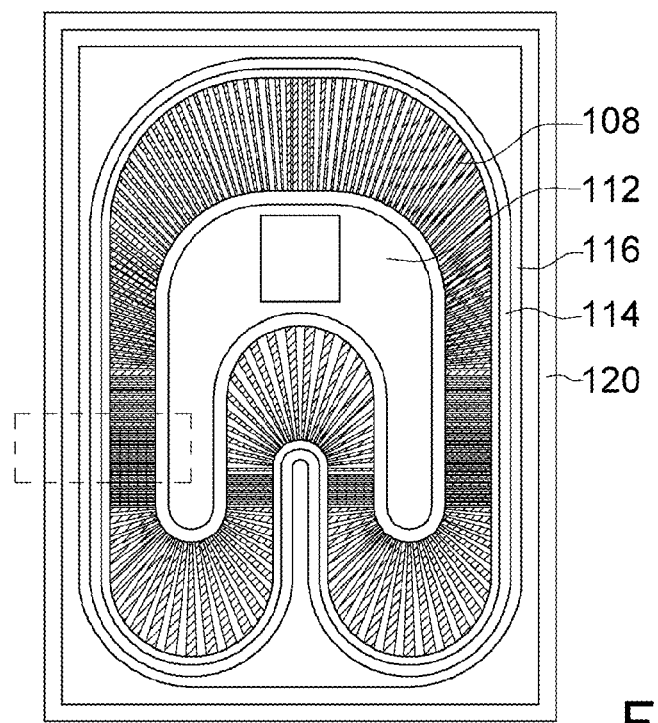
FIG. 9 illustrates a top view of the semiconductor structure according to one embodiment.
Figure 10:
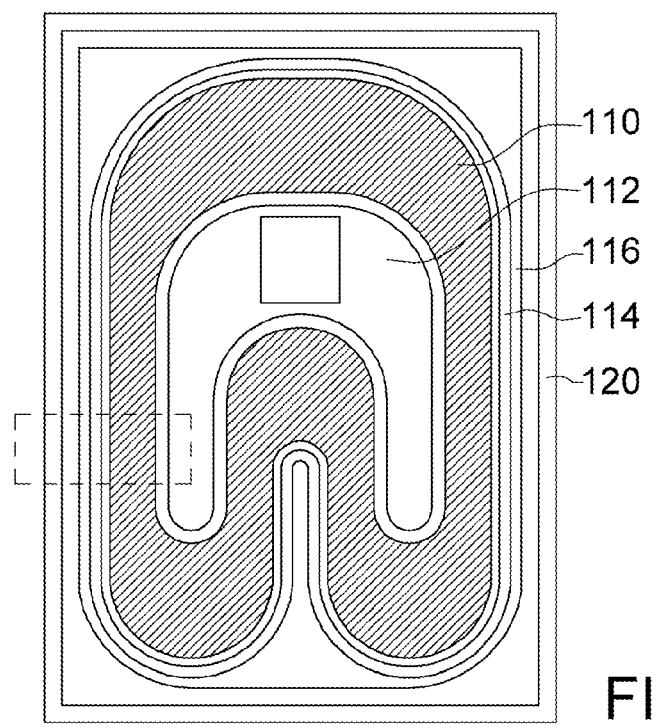
FIG. 10 illustrates a top view of the semiconductor structure according to one embodiment.
Figure 11:
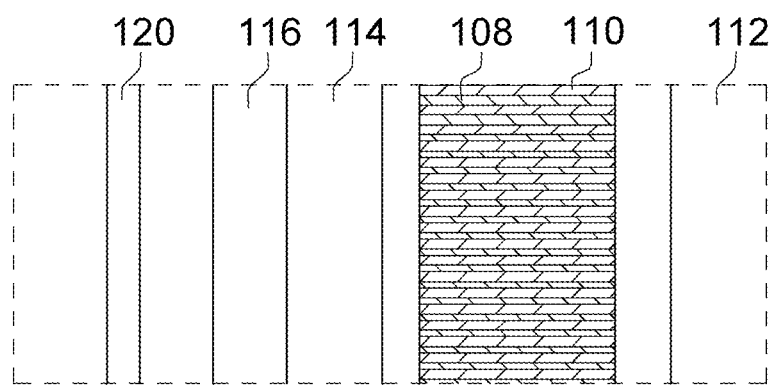
FIG. 11 illustrates a top view of the semiconductor structure according to one embodiment.

FIGS. 1-3 illustrate top views of a semiconductor structure according to one embodiment. FIG. 4 and FIG. 5 illustrate cross-section views of the semiconductor structure according to one embodiment. FIG. 6 and FIG. 7 illustrate cross-section views of the semiconductor structure according to one another embodiment. FIG. 8 illustrates an I-V curve of the semiconductor structure in one embodiment. FIGS. 9-11 illustrate top views of the semiconductor structure according to one another embodiment.

Referring to FIG. 4, the semiconductor structure comprises a substrate 2. A first doped well 4 is on the substrate 2. A second doped well 6 is on the first doped well 4. Doped strips 8 are on the first doped well 4. A doped top region 10 is on the doped strip 8. A first doped electrode 12 is on the first doped well 4. A second doped electrode 14 is on the second doped well 6. A third doped electrode 16 is on the second doped well 6. A third doped well 18 is on the substrate 2. A fourth doped electrode 20 is on the third doped well 18. A dielectric structure 22 is on the substrate 2. A gate structure 24 is on the second doped well 6 between the second doped electrode 14 and the dielectric structure 22, and extended on the dielectric structure 22. An interlayer dielectric film (ILD) 26 is on the substrate 2. A conductive layer 28 is filled in an opening of the interlayer dielectric film 26, and electrically connected to the first doped electrode 12, the second doped electrode 14, the third doped electrode 16, the fourth doped electrode 20 and the gate structure 24.

The semiconductor structure as shown in FIG. 5 differs from the semiconductor structure as shown in FIG. 4 in that the doped strips 8 are omitted. In one embodiment, the semiconductor structure as shown in FIG. 4 is drawn along AA' line in FIG. 3. The semiconductor structure as shown in FIG. 5 is drawn along BB' line in FIG. 3. FIG. 3 is an enlarged view of a portion, indicated by a dotted line, of the semiconductor structure shown in FIG. 1 and FIG. 2. FIG. 3 shows the doped strips 8, the doped top region 10, the first doped electrode 12, the second doped electrode 14, the third doped electrode 16 and the fourth doped electrode 20 of the semiconductor structure. FIG. 1 omits the doped top region 10 shown in FIG. 3. FIG. 2 omits the doped strips 8 shown in FIG. 3.

Referring to FIG. 4, in one embodiment, the first doped well 4, the doped top region 10, the first doped electrode 12 and the second doped electrode 14 have a first conductivity type. The substrate 2, the second doped well 6, the doped strips 8, the third doped electrode 16, the third doped well 18 and the fourth doped electrode 20 have a second conductivity type opposite to the first conductivity type. For example, the first conductivity type is N type, and the second conductivity type is P type. In other embodiments, the first conductivity type is P type, and the second conductivity type is N type. In one embodiment, the semiconductor structure is a MOS such as NMOS or PMOS. The first doped electrode 12 may be used as a drain. The second doped electrode 14 may be used as a source. In other embodiments, the first doped electrode 12 and the second doped electrode 14 have opposite conductivity types. For example, the first doped electrode 12 has P type conductivity, and the second doped electrode 14 has N type conductivity. In this case, the semiconductor structure may be an IGBT. The semiconductor structure as shown in FIG. 6 and FIG. 7 may be a diode.

Referring to FIG. 3, the doped strips 8 are separated from each other. In embodiments, the doped strip 8 has a width W of 0.2 um-20 um. The doped strips 8 have a gap distance D of 0.2 um-20 um therebetween. Referring to FIGS. 3-5, the doped top region 10 is on the doped strip 8 and extended on the first doped well 4 between the doped strips 8. Using the doped top region 10 could increase efficiency and degree of the depletion of the doped strip 8. Thus the on-state resistance of the device is reduced. The on-state current is increased to have a high efficiency. Nevertheless, the device can be operated by a high operating voltage. The dopant concentration at the drain region is increased due to the doped top region 10 of big area. Therefore, the resistance of the surface of the drain region in decreased. The semiconductor structure in embodiments could be applied for a HV, ultra-HV MOS, IGBT and diode. Referring to FIG. 8, compared with a conventional semiconductor structure, the on-state resistance and the current at drain side of the semiconductor structure (ultra-HV LDMOS) in embodiments can be reduced by about 15% and increased by about 17.5% respectively. In addition, the breakdown voltage of the semiconductor structure in embodiment can be kept over 700 V.

The semiconductor structure can also have a design layout as shown in FIGS. 9-11. FIG. 11 is an enlarged view of a portion, indicated by a dotted line, of the semiconductor structure shown in FIG. 9 and FIG. 10. FIG. 11 shows the doped strips 108, the doped top region 110, the first doped electrode 112, the second doped electrode 114, the third doped electrode 116 and the fourth doped electrode 120 of the semiconductor structure. FIG. 9 omits the doped top region 110 in FIG. 11. FIG. 10 omits the doped strips 108 in FIG. 11.

FIGS. 12-19 illustrate a manufacturing method for the semiconductor structure according to one embodiment. Figures labeled with A illustrates cross-section views of a portion, having the doped top region on the doped strip, of the semiconductor structure, such as a cross-section view along AA' line in FIG. 3. Figures labeled with B illustrates cross-section views of a portion, having the doped top region on the first doped well extended between the doped strips, of the semiconductor structure, such as a cross-section view along BB' line in FIG. 3.

Figure 12A:
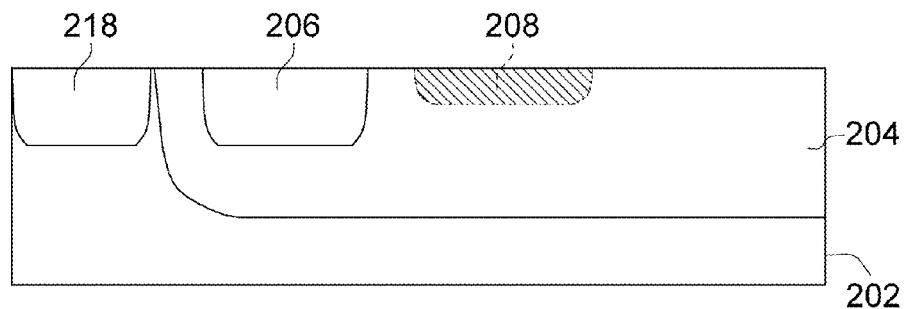
FIGS. 12A-19B illustrate a manufacturing method for a semiconductor structure according to one embodiment.
Figure 12B:
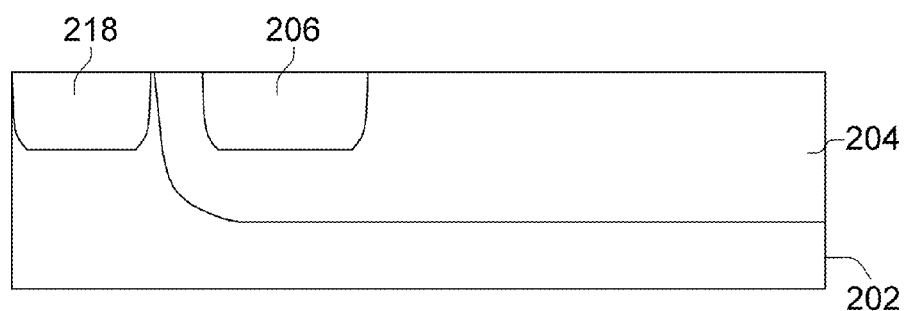

Referring to FIG. 12A and FIG. 12B, the substrate 202, such as SOI, is provided. The first doped well 204 is formed on the substrate 202. The second doped well 206 is formed on the first doped well 204. The third doped well 218 is formed on the substrate 202. In one embodiment, the second doped well 206 and the third doped well 218 are simultaneously formed by a patterned mask layer. Referring to FIG. 12A, the doped strips 208 may be formed on the first doped well 204.

Figure 13A:
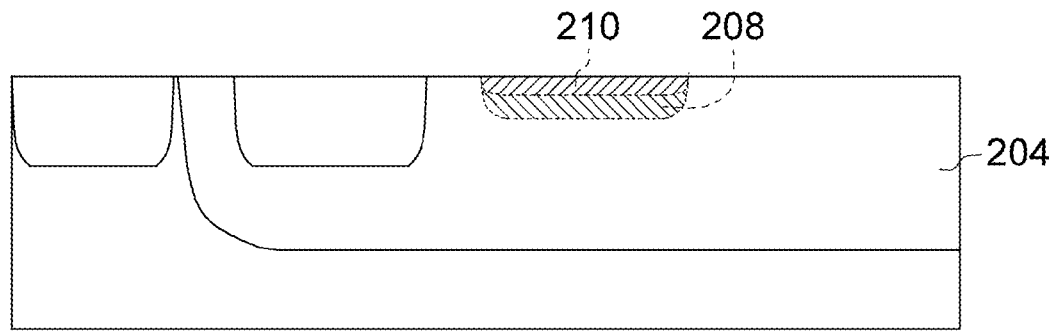
Figure 13B:
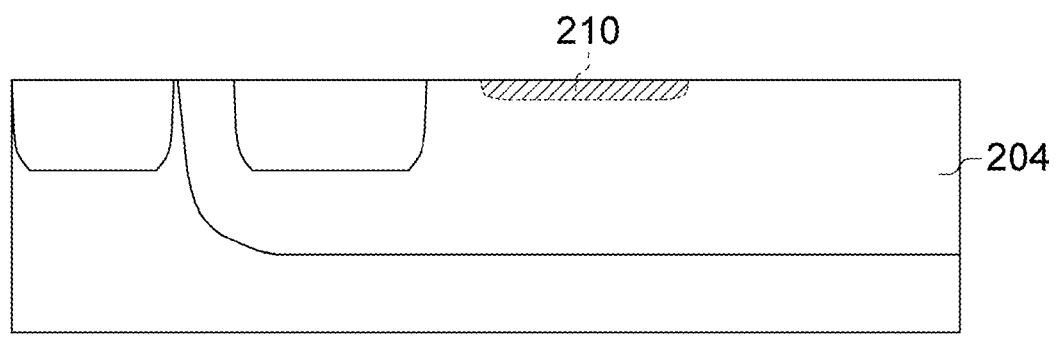

Referring to FIG. 13A and FIG. 13B, the doped top region 210 is formed on the doped strip 208 and the first doped well 204. In embodiments, the doped top region 210 and the doped strips 208 are respectively formed by using different masks.

Figure 14A:
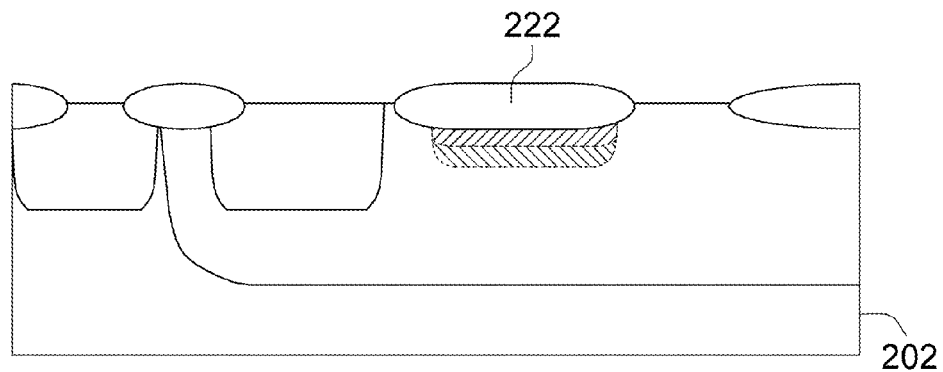
Figure 14B:
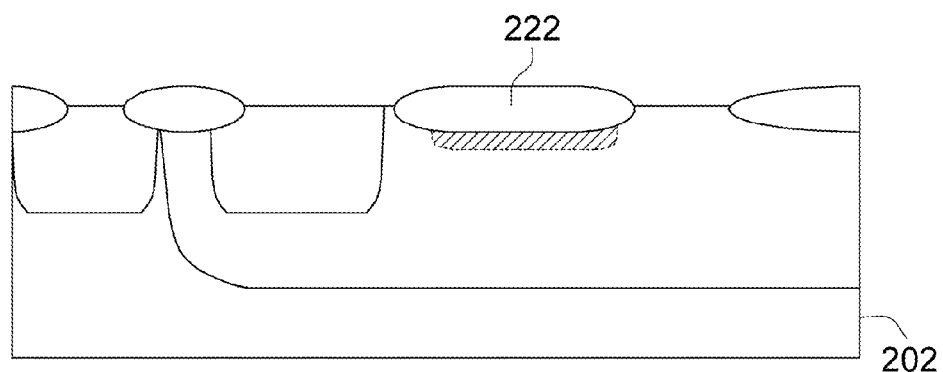

Referring to FIG. 14A and FIG. 14B, the dielectric structure 222 is formed on the substrate 202. The dielectric structure 222 is not limited to a FOX as shown in FIG. 14A and FIG. 14B. The dielectric structure 222 may also comprise a STI.

Figure 15A:
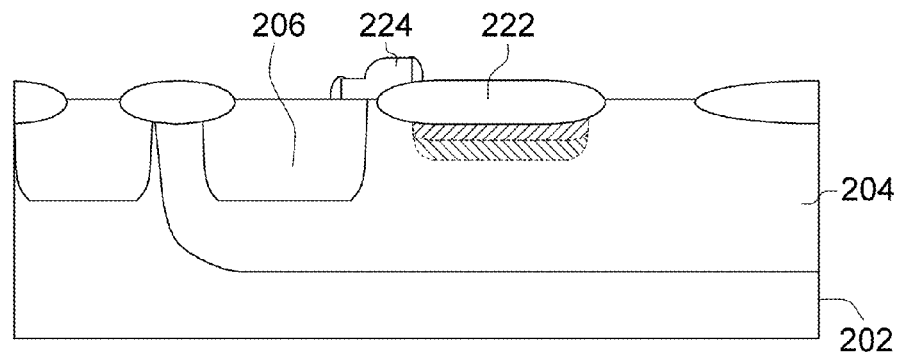
Figure 15B:
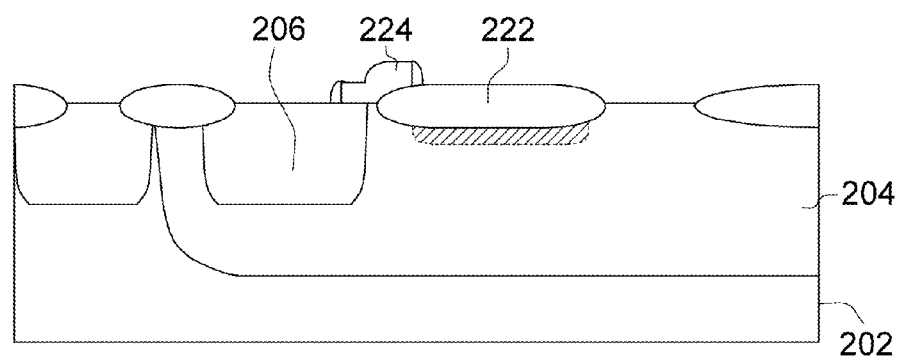

Referring to FIG. 15A and FIG. 15B, the gate structure 224 may be formed on the first doped well 204 and the second doped well 206, and extended on the dielectric structure 222. The gate structure 224 may comprise a gate dielectric layer, a gate electrode layer and a spacer. The gate electrode layer is formed on the gate dielectric layer. The spacers are formed on opposite sidewalls of the gate dielectric layer and the gate electrode layer. In one embodiment, before forming the gate dielectric layer, a SAC oxide is formed on the surface of the substrate 202. Then the SAC oxide is removed. Therefore, the gate dielectric layer having excellent property can be formed. The gate electrode layer may comprise a polysilicon layer and a metal silicide layer, such as tungsten silicide, formed on the polysilicon layer. The spacer may comprise silicon dioxide such as tetraethoxy silane (TEOS).

Figure 16A:
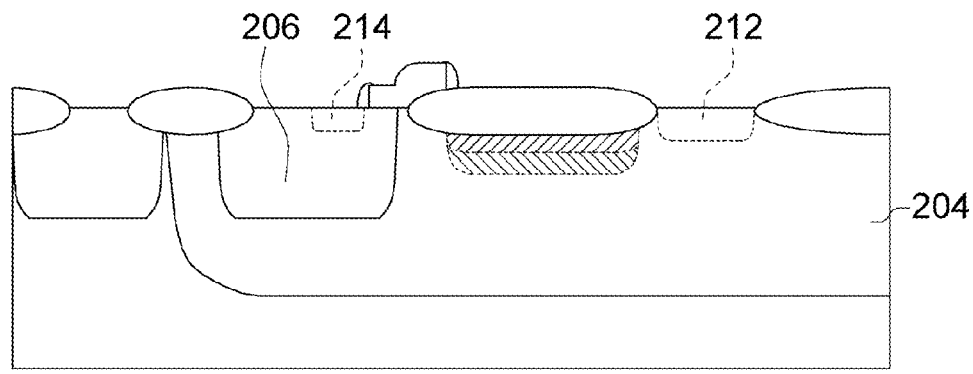
Figure 16B:
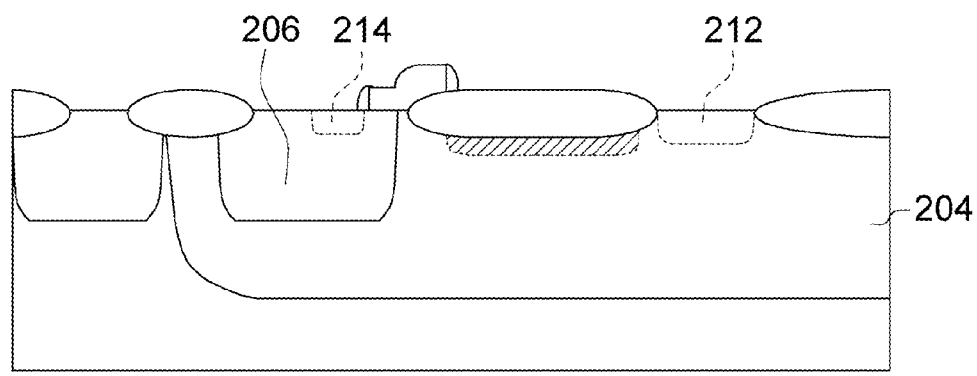
Figure 17A:
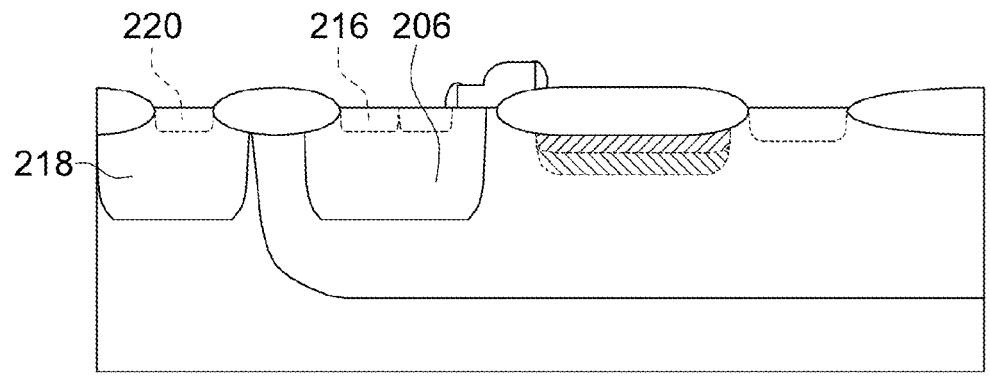
Figure 17B:
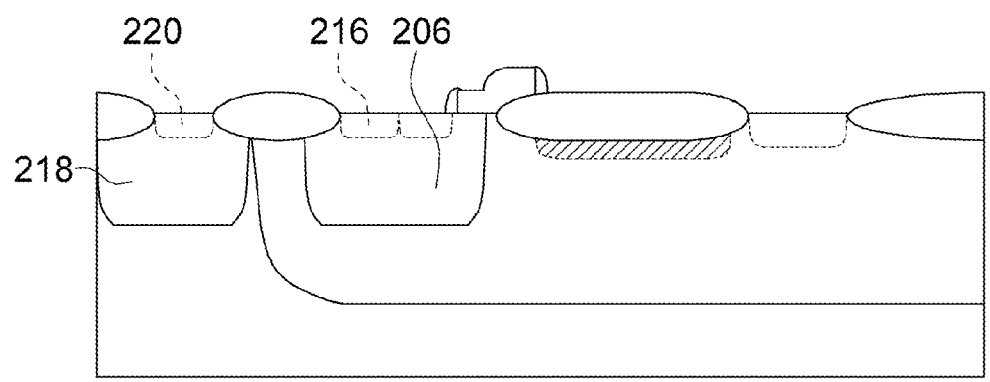
Figure 18A:
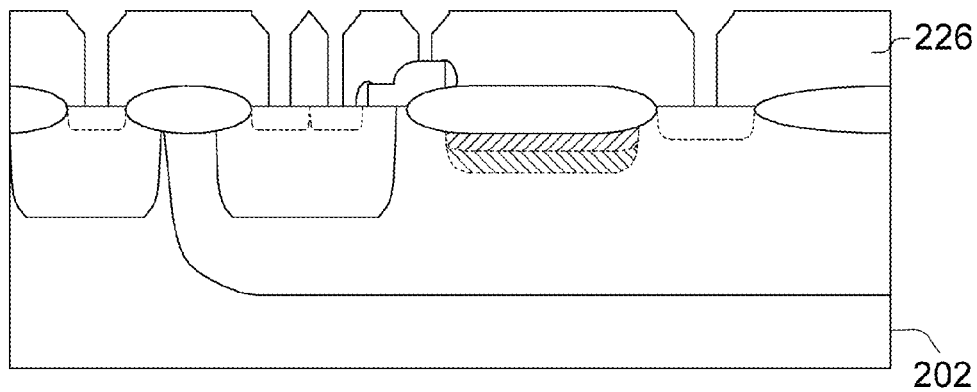
Figure 18B:
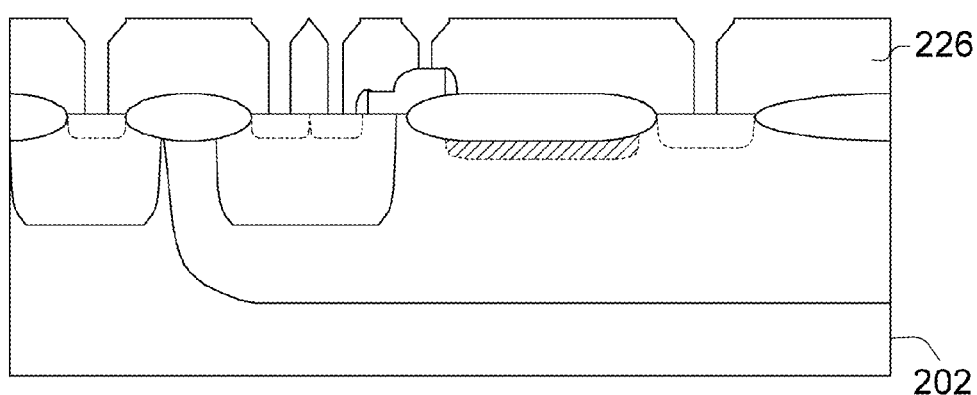
Figure 19A:
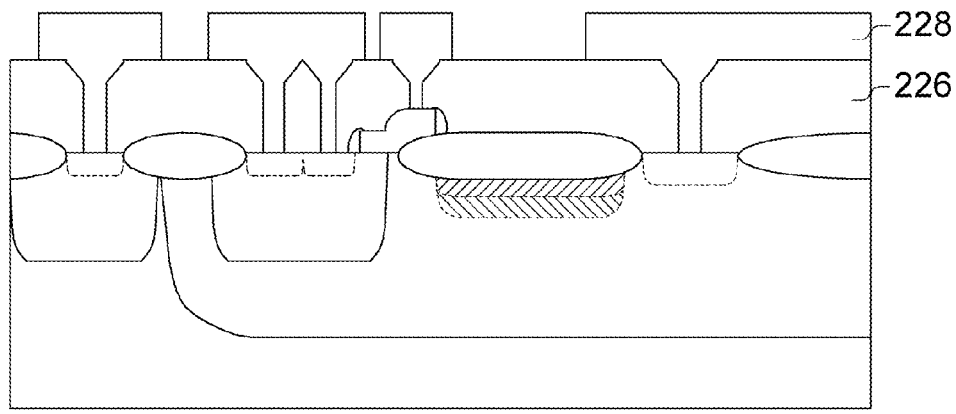
Figure 19B:
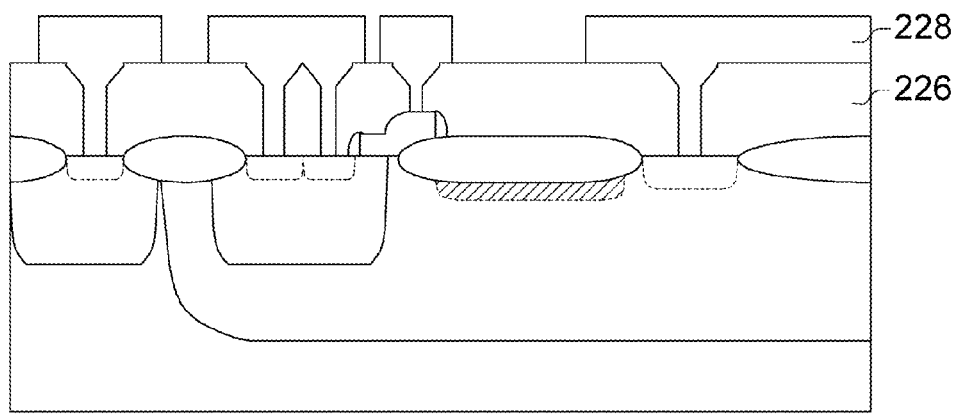

Referring to FIG. 16A and FIG. 16B, the first doped electrode 212 is formed on the first doped well 204. The second doped electrode 214 is formed on the second doped well 206. In one embodiment, the first doped electrode 212 and the second doped electrode 214 are formed by a heavy doping. Referring to FIG. 17A and FIG. 17B, the third doped electrode 216 is formed on the second doped well 206. The fourth doped electrode 220 is formed on the third doped well 218. In one embodiment, the third doped electrode 216 and the fourth doped electrode 220 are formed by a heavy doping. Referring to FIG. 18A and FIG. 18B, the interlayer dielectric film 226 is formed on the substrate 202. Referring to FIG. 19A and FIG. 19B, the conductive layer 228 is formed for filling the opening of the interlayer dielectric film 226. The conductive layer 228 may comprise metal.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a first doped well;
    a first doped electrode;
    a second doped electrode;
    doped strips on the first doped well between the first doped electrode and the second doped electrode, wherein the doped strips are separated from each other; and
    a doped top region on the doped strips and extended on the first doped well between the doped strips, wherein, the first doped well and the doped top region have a first conductivity type, the doped strips have a second conductivity type opposite to the first conductivity type.

2. The semiconductor structure according to claim 1, further comprising:
    a dielectric structure on the doped top region;
    a second doped well between the first doped well and the second doped electrode; and
    a gate structure on the second doped well between the second doped electrode and the dielectric structure.

3. The semiconductor structure according to claim 2, wherein the gate structure is extended on the dielectric structure.

4. The semiconductor structure according to claim 1, wherein the doped strips each have a width of 0.2 um-20 um.

5. The semiconductor structure according to claim 1, wherein the doped strips have a gap distance of 0.2 um-20 um therebetween.

6. The semiconductor structure according to claim 1, wherein the doped strips each have a width of 0.2 um-20 um, and the doped strips have a gap distance of 0.2 um-20 um therebetween.

7. The semiconductor structure according to claim 1, wherein the first doped electrode and the second doped electrode have opposite conductivity types.

8. The semiconductor structure according to claim 1, wherein the first doped electrode and the second doped electrode have the first conductivity type.

9. The semiconductor structure according to claim 1, wherein the semiconductor structure is a MOS, an IGBT or a diode.

10. The semiconductor structure according to claim 1, wherein the doped strips are separated by the first doped well.

* * * * *